United States Patent
Watanabe et al.

(10) Patent No.: US 11,527,281 B2
(45) Date of Patent: Dec. 13, 2022

(54) SIGNAL BUFFER CIRCUIT

(71) Applicant: Micron Technology, Inc., Boise, ID (US)

(72) Inventors: Kenichi Watanabe, Kanagawa (JP); Moeha Shibuya, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/218,023

(22) Filed: Mar. 30, 2021

(65) Prior Publication Data

US 2022/0319580 A1    Oct. 6, 2022

(51) Int. Cl.
G11C 11/4093    (2006.01)
H01L 27/108    (2006.01)

(52) U.S. Cl.
CPC .... G11C 11/4093 (2013.01); H01L 27/10897 (2013.01)

(58) Field of Classification Search
CPC .............. H01L 27/10897; G11C 11/4093

USPC ........................................................ 365/149
See application file for complete search history.

(56) References Cited

U.S. PATENT DOCUMENTS 9,711,407 B2 *    7/2017    Or-Bach .......... H01L 27/11578

* cited by examiner

*Primary Examiner* — Fernando Hidalgo
(74) *Attorney, Agent, or Firm* — Dorsey & Whitney LLP

(57) ABSTRACT

Apparatuses with a signal line in a semiconductor device are described. An example apparatus includes one or more power supply voltage lines in a first conductive layer, a plurality of transistors and a signal line in a second conductive layer. Each transistor of the plurality of transistors includes an active region disposed in a substrate and a gate electrode above the active region. The signal line in the second conductive layer is below the first conductive layer and above the active regions of the plurality of transistors. The signal line is coupled to the gate electrodes of the plurality of transistors. The signal line has electrical resistance higher than electrical resistance of the power supply voltage line.

18 Claims, 10 Drawing Sheets

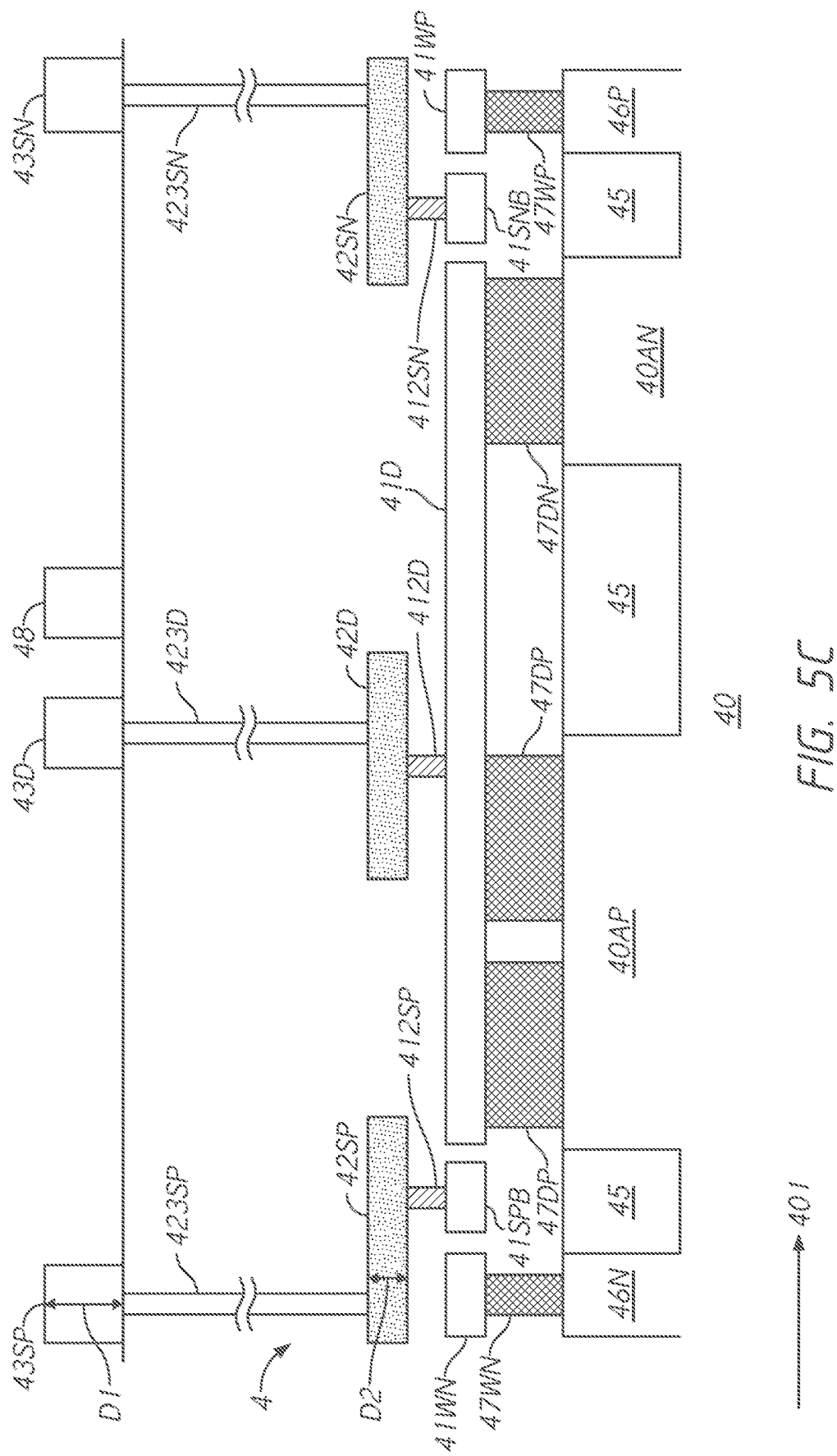

SIGNAL BUFFER CIRCUIT

BACKGROUND

Reduced chip size, high data reliability, reduced power consumption and efficient power usage are features that are demanded from semiconductor memory. In order to reduce chip size, while enhancing current driving capability, a circuit in a conventional semiconductor device includes a plurality of transistors parallel-coupled to each other.

In a semiconductor memory device, a control signal may be distributed to multiple circuits. For example, a data transmission circuit between a data input/output (IO) circuit and a read/write amplifier circuit may receive timing control signals to control data register input and output timings from global control signal lines. The timing control signals are provided to logic circuits and buffers in the data transmission circuit to control data input/output timings from local control signal lines. Providing the received control signal directly to the logic circuits and buffers in the data transmission circuit may result in an undesirable load to the global control signal line. To prevent the undesirable load, a buffer may be provided for each block (e.g., each data queue DQx). The buffer receives the control signals from the global control signal lines and provides the control signals to the local control signal lines. However, high power consumption among the local control signal lines may be caused due to parasitic capacitance between the local control signal lines in a metal layer.

BRIEF DESCRIPTION OF THE DRAWINGS

FIGS. 5A-5C are vertical cross-sectional views of a structure of the inverter according to the embodiment of the present disclosure.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

The following describes a semiconductor memory device 100 and a method of forming the same according to the embodiment with reference to FIG. 1 to FIG. 5C. The dimensions and the ratios of dimensions of each portion in each drawing do not necessarily coincide with the dimensions and the ratios of dimensions of the actual semiconductor device.

Figure 1:
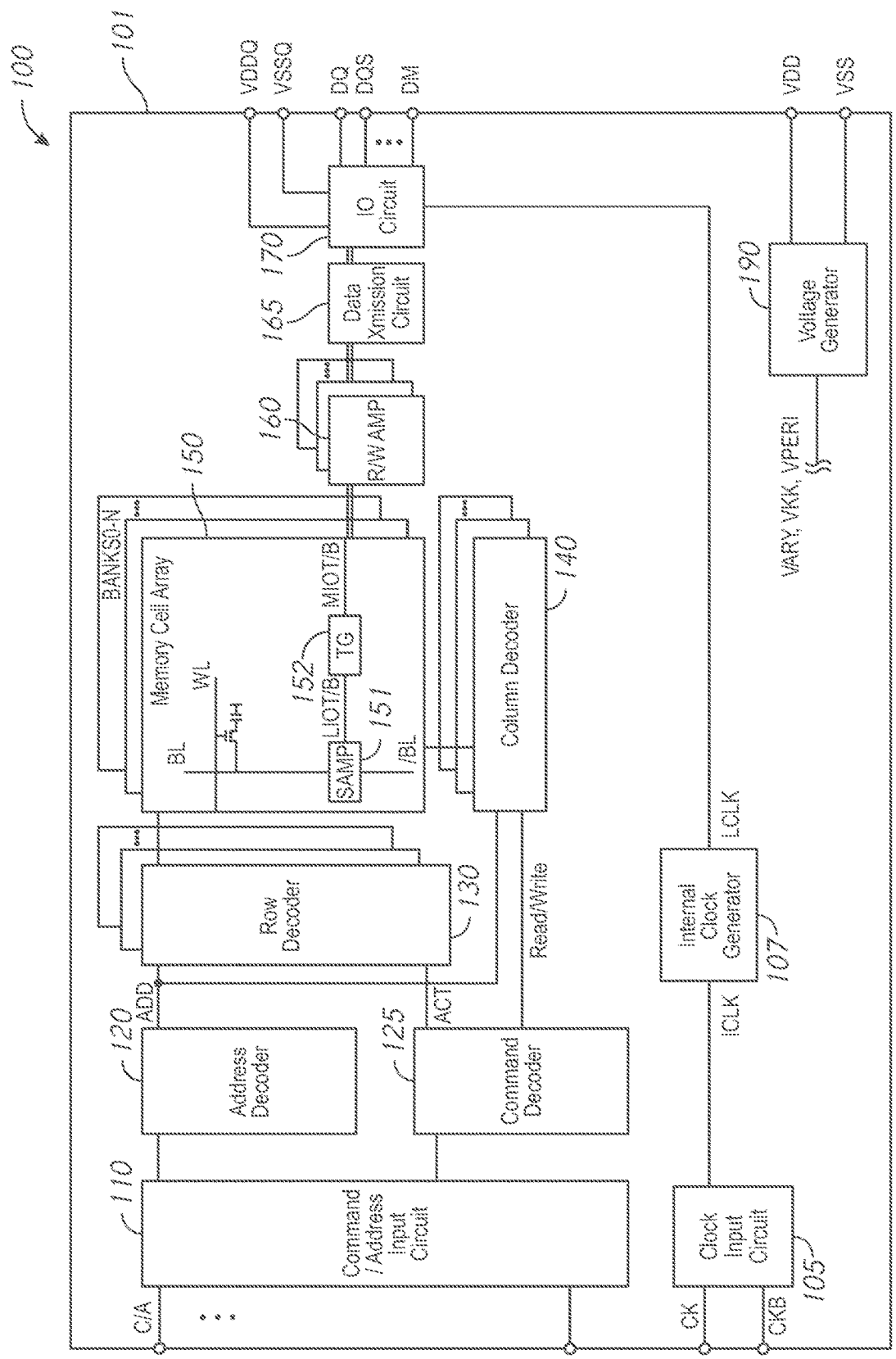
FIG. 1 is a schematic block diagram of a semiconductor memory device, in accordance with an embodiment of the present disclosure.

FIG. 1 is a schematic block diagram of a chip 101 of a semiconductor memory device 100, in accordance with an embodiment of the present disclosure. For example, the semiconductor memory device 100 is an apparatus that may include a plurality of chips, including the chip 101. For example, the chip 101 may include a clock input circuit 105, an internal clock generator 107, a command and address input circuit 110, an address decoder 120, a command decoder 125, a plurality of row decoders 130, a memory cell array 150 including sense amplifiers 151 and transfer gates 152, a plurality of column decoders 140, a plurality of read/write amplifiers 160, a data transmission circuit 165, an input/output (IO) circuit 170, and a voltage generator circuit 190. The semiconductor memory device 100 may include a plurality of external terminals including address and command terminals coupled to command/address buses, clock terminals CK and /CK, data terminals DQ, a data strobe terminal DQS, and a data mask terminal DM and power supply terminals VDD, VSS, VDDQ, and VSSQ.

The memory cell array 150 includes a plurality of banks (e.g., Banks0-7), each bank including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers SAMP 151 are located for their corresponding bit lines BL and coupled to at least one respective local I/O line (e.g., LIOT/B) further coupled to a respective one of at least two main I/O line pairs (e.g., MIOT/B), via transfer gates TG 152, which function as switches.

The command and address input circuit 110 may receive an address signal and a bank address signal from outside at the command/address terminals via the command/address bus (C/A) and transmit the address signal and the bank address signal to the address decoder 120. The address decoder 120 may decode the address signal received from the command and address input circuit 110 and provide address signals ADD. The address signals ADD may include a row address signal to the row decoder 130, and a column address signal to the column decoder 140. The address decoder 120 may also receive the bank address signal and provide the bank address signal to the row decoder 130 and the column decoder 140.

The command and address input circuit 110 may receive a command signal from outside, such as, for example, at the command/address terminals via the command/address buses and provide the command signal to the command decoder 125. The command decoder 125 may decode the command signal and provide generate various internal command signals. For example, the internal command signals may include a row command signal to select a word line, a column command signal, such as a read command or a write command, to select a bit line.

Accordingly, when an activation command is issued and a row address is timely supplied with the activation command, and a read command is issued and a column address is timely supplied with the read command, read data is read from a memory cell in the memory cell array 150 designated by the row address and the column address. The read/write amplifiers 160 may receive the read data and provide the read data to the data transmission circuit 165. The data transmission circuit 165 may receive the read data from the read/write amplifiers 160 and provide the read data to the IO circuit 170 responsive to control signals that control timings to receive the read data from the read/write amplifiers 160 and further responsive to control signals that control timings to provide the read data to the IO circuit. The IO circuit 170 may provide the read data from the data transmission circuit 165 to outside via the data terminals DQ together with a data strobe signal at the data strobe terminal DQS and a data mask signal at the data mask terminal DM. Similarly, when the activation command is issued and a row address is timely supplied with the activation command, and a write command is issued and a column address is timely supplied with the write command, the IO circuit 170 may receive write data at the data terminals DQ, DQS, DM, together with a data strobe signal at DQS and a data mask signal at DM and provide the write data to the data transmission circuit 165. The data transmission circuit 165 may receive the write data from the IO circuit 170 and provide the write data to the read/write amplifiers 160 responsive to control signals that control timings to receive the write data from IO circuit 170 and further responsive to control signals that control timings to provide the write data to the read/write amplifiers 160 that may provide the write data to the memory cell array 150. Thus, the write data may be written in the memory cell designated by the row address and the column address.

Turning to the explanation of the external terminals included in the semiconductor device 100, the clock terminals CK and CKB may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK. For example, a DLL circuit may be used as the internal clock generator 107. The internal clock generator 107 may provide the phase controlled internal clock signal LCLK to the IO circuit 170. The IO circuit 170 may use the phase controlled internal clock signal LCLK as a timing signal for determining an output timing of read data.

The power supply terminals may receive power supply voltages VDD and VSS. These power supply voltages VDD and VSS may be supplied to a voltage generator circuit 190. The voltage generator circuit 190 may generate various internal voltages, VKK, VARY, VPERI, and the like based on the power supply voltages VDD and VSS. The internal voltage VKK may be used in the row decoder 130, the internal voltage VARY may be used in the sense amplifiers 151 included in the memory cell array 150, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Structures of a signal buffer circuit in the semiconductor memory device 100 in accordance with an embodiment of the present disclosure will be described with reference to FIGS. 2A to 5C. Some embodiments of the signal buffer circuit in a data transmission circuit 165 will be described in details below. However, a signal buffer circuit may be included in any block in the semiconductor memory device 100 which may provide a signal to a plurality of circuits. In some embodiments, a command decoder 125 may include a signal buffer circuit that may provide a control signal, such as an enable signal or a reset signal, to a row decoder 130 and/or a column decoder 140.

Figure 2A:
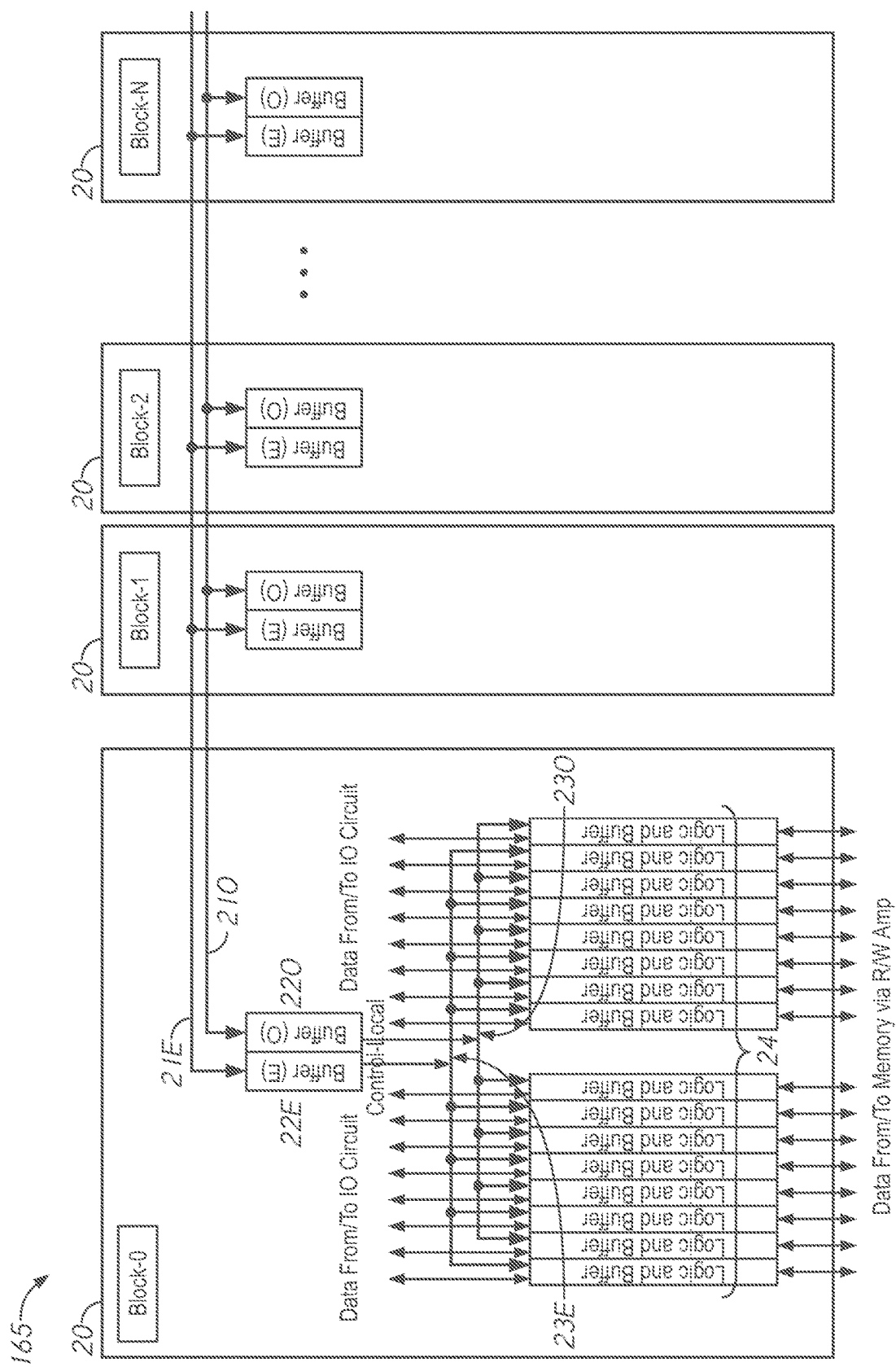
FIG. 2A is a schematic diagram of a data transmission circuit according to an embodiment of the present disclosure.

FIG. 2A is a schematic diagram of a data transmission circuit 165 according to an embodiment of the present disclosure. The data transmission circuit 165 may include block transmission circuits 20 provided for corresponding blocks Block-0 to Block-N. In some embodiments, each block transmission circuit 20 may be provided for each data queue (DQ). In some embodiments, each block transmission circuit 20 may include logic and buffer circuits 24 that transmit a plurality of bits between the read/write amplifier 160 and the IO circuit 170. Each of the logic and buffer circuits 24 includes logic circuits and a buffer circuit, and may provide a respective bit of the plurality of bits provided in parallel between the read/write amplifier 160 and the IO circuit 170.

The plurality of bits may include even bits and odd bits. Positions of bits in the plurality of bits may be arranged from a least significant bit (LSB) to a most significant bit (MSB). Each block transmission circuit 20 may include a signal buffer circuit 22E and a signal buffer circuit 22O. The signal buffer circuit 22E in each block transmission circuit 20 may be coupled to an even control signal line 21E. The even control signal line 21E may provide an even control signal to the signal buffer circuits 22E of the block transmission circuits 20 for the blocks Block-0 to Block-N. The signal buffer circuit 22E in each block transmission circuit 20 may be coupled to an even internal control signal line 23E. The even internal control signal line 23E is coupled to even ones of the logic and buffer circuits 24 that may receive and provide the even bits. The signal buffer circuit 22E in each block transmission circuit 20 may provide the received even control signal to the even ones of the logic and buffer circuits 24 via the even internal control signal line 23E.

Similarly, the signal buffer circuit 22O in each block transmission circuit 20 may be coupled to an odd control signal line 21O. The odd control signal line 21O may provide an odd control signal to the signal buffer circuits 22O of the block transmission circuits 20 for the blocks Block-0 to Block-N. The signal buffer circuit 22O in each block transmission circuit 20 may be coupled to an odd internal control signal line 23O. The odd internal control signal line 23O is coupled to odd ones of the logic and buffer circuits 24 that may receive and provide the odd bits. The signal buffer circuit 22O may provide the received odd control signals to the odd ones of the logic and buffer circuits 24 via the odd internal control signal line 23O. The even control signals and the odd control signals may respectively include, for example, a read input timing signal, a read output timing signal, a write input timing signal, a write output timing signal and/or a reset signal.

During a mad operation, each of the logic and buffer circuits 24 may receive each bit of the plurality of bits of read data from the read/write amplifier 160 at an input timing responsive to the read input control signal. The read input control signal indicates the input timing to receive each bit of the plurality of bits of read data. Each of the logic and buffer circuits 24 may provide the respective received bit of the plurality of bits of read data to the IO circuit 170 at an output timing responsive to the read output control signal. The read output control signal indicates the output timing to provide each bit of the plurality of bits of read data. During a write operation, each of the logic and buffer circuits 24 may receive each bit of the plurality of bits of write data from the IO circuit 170 responsive to a write input control signal. The write input control signal indicates the input timing to receive each bit of the plurality of bits of write data. Each of the logic and buffer circuits 24 may provide the respective received bit of the plurality of bits of write data to the read/write amplifier 160 at an output timing responsive to the write output control signal. The write output control signal indicates the output timing to provide each bit of the plurality of bits of write data.

Figure 2B:
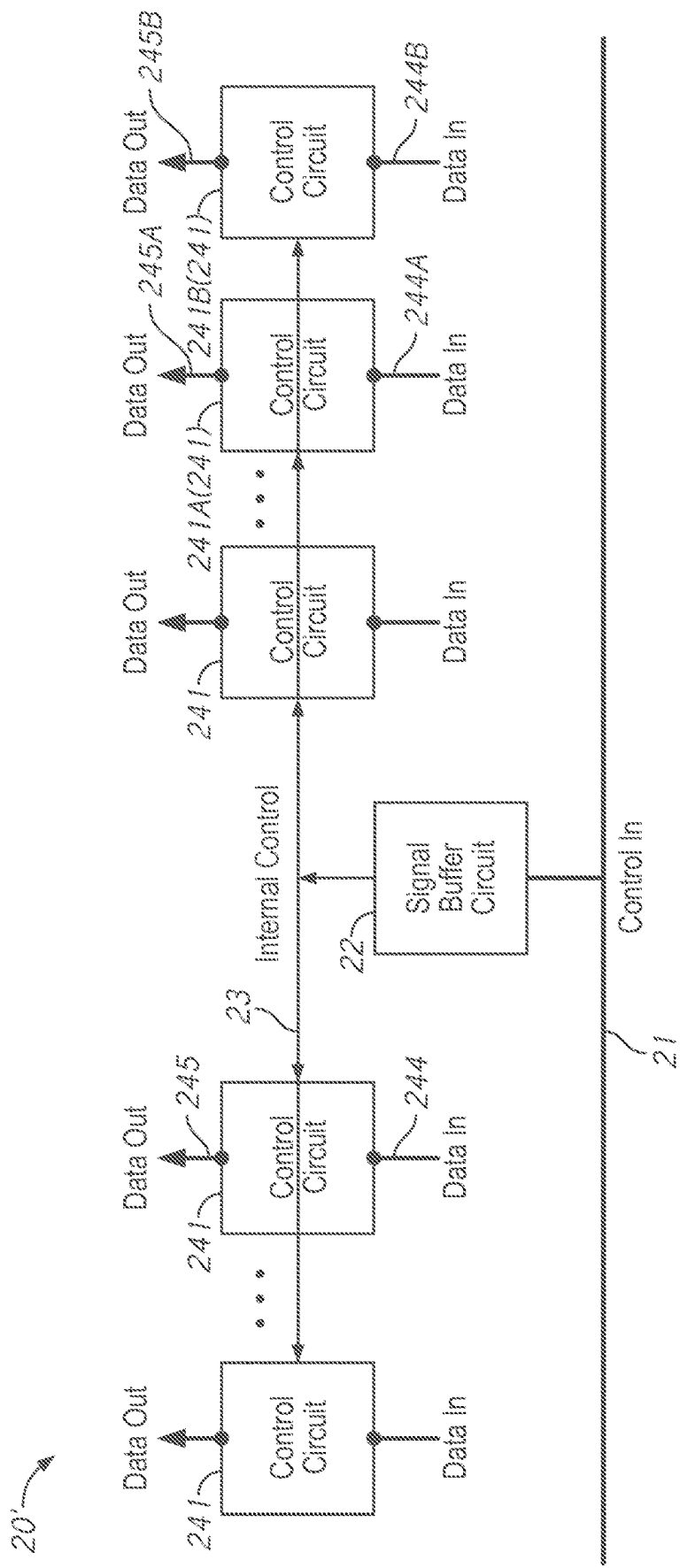
FIG. 2B is a schematic diagram of a portion of a block transmission circuit according to an embodiment of the present disclosure.

FIG. 2B is a schematic diagram of a portion 20' of a block transmission circuit according to an embodiment of the present disclosure. In some embodiment, the portion 20' may be a portion of the block transmission circuit 20 of FIG. 2A. The portion 20' may include a signal buffer circuit 22 and control circuits 241. In some embodiments, the portion 20' may include a portion of circuits and lines associated with either even bits or odd bits.

In some embodiments, each of the signal buffer circuit 22E and the signal buffer circuit 22O in FIG. 2A may include the signal buffer circuit 22. In some embodiments, the signal buffer circuit 22 may include inverters. The signal buffer circuit 22 may receive a control signal from a control signal line 21. In some embodiments, the control signal line 21 may be the even control signal line 21E and/or the odd control signal line 21O. The control signal line 21 may include conductive material. For example, the conductive material may have low electrical resistance, such as copper (Cu) or aluminum (Al). In some embodiments, the control signal line 21 may be disposed in a second metal layer (metal 2). Responsive to the control signal from the control signal line 21, the signal buffer circuit 22 may provide the control signal with a delay to an internal control signal line 23. Each of the even internal control signal line 23E and the odd internal control signal line 23O in FIG. 2A may include the internal control signal line 23. The internal control signal line 23 may include conductive material. In some embodiments, the conductive material included in the internal control signal line 23 may have higher electrical resistance relative to the conductive material of the control signal line 21. The material included in the internal control signal line 23 may also have hardness, heat resistance, corrosion resistance, and/or wear resistance. For example, the material may include at least one of tungsten (W) or titanium nitride (TiN). In some embodiments, the internal control signal line 23 may be disposed in a local interconnect layer between the second metal layer and a substrate (e.g., a semiconductor substrate 251 in FIG. 2C) on which the block transmission circuit 20 is disposed. In some embodiments, the local interconnect layer including the internal control signal line 23 may have a thickness (e.g., height) less than a thickness of the second metal layer including the control signal line 21.

The control circuits 241 may be coupled to the internal control signal line 23. The control circuits 241 may receive the control signal from the internal control signal line 23. In some embodiments, each of the control circuits 241 may be included in each of the logic and buffer circuits 24 in FIG. 2A.

The control circuit 241 may receive the control signal from the internal control signal line 23. The control circuit 241 may also receive a data signal at an input node Data In 244. Responsive to the inverted control signal, the control circuit 241 may provide the data signal with inversion to an output node Data Out 245. In some embodiments, the input node Data In 244 and the output node Data Out 245 may be disposed in a conductive layer. The conductive layer including the input node Data In 244 and the output node Data Out 245 may include conductive material. The conductive material may have relatively low electrical resistance, for example, such as copper (Cu) or aluminum (Al). In some embodiments, the conductive layer including the input node Data In 244 and the output node Data Out 245 may be formed as a first metal layer (metal 1) below the second metal layer (metal 2) including the control signal 21. The second metal layer (metal 2) may have a thickness greater than a thickness of the first metal layer (metal 1). The first metal layer (metal 1) may be disposed between the second metal layer (metal 2) and the local interconnect layer including the internal control signal line.

As described above, the signal buffer circuit 22 may receive a control signal to the block transmission circuit 20 provided on the control signal line 21 in a conductive layer, such as the metal 2 layer. The signal buffer circuit 22 may further provide the control signal with a delay to the control circuits 241 on the internal control signal line 23 in the local interconnect layer between the conductive layer of the control signal line 21 and the substrate. The control circuits 241 may receive the control signal on the internal control signal line 23, and responsive to the control signal, may receive the data signal at the input node Data In 244 and provide the data signal at the output node Data Out 245.

Figure 2C:
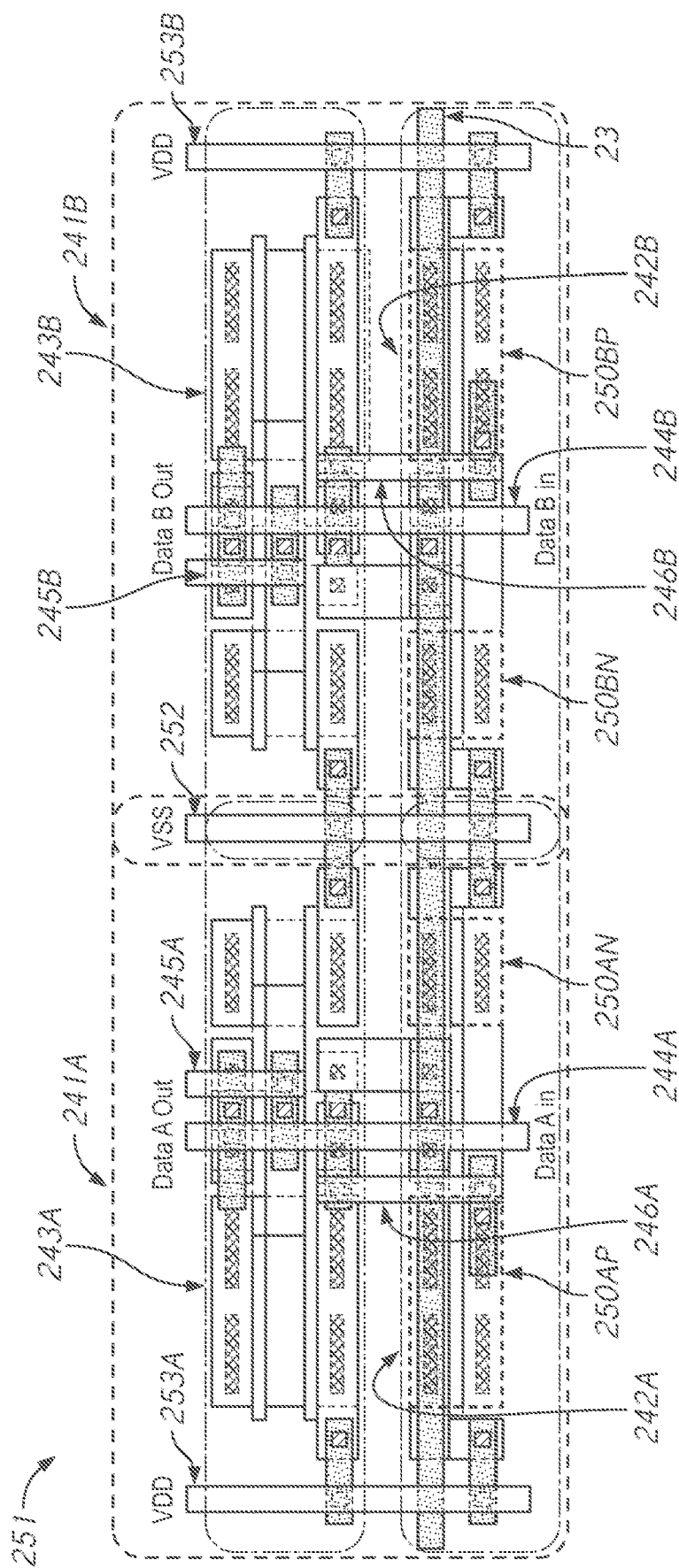
FIG. 2C is a schematic diagram of control circuits according to an embodiment of the present disclosure.

FIG. 2C is a schematic diagram of the control circuits 241A and 241B, according to an embodiment of the present disclosure. In the following description, the above means the above when a semiconductor substrate 251 in FIG. 2C is a bottom. The control circuits 241A and 241B may be coupled to the internal control signal line 23. The control circuits 241A and 241B may receive the control signal from the internal control signal line 23. The control circuit 241A may include inverters 242A and 243A and an internal node Int 246A coupled to the inverters 242A and 243A. The inverter 242A may receive the control signal from the internal control signal line 23. Responsive to the control signal from the internal control signal line 23, the inverter 242A may invert the control signal and provide the inverted control signal on the internal node Int 246A to the inverter 243A. Similarly, the control circuit 241B may include inverters 242B and 243B and an internal node Int 246B coupled to the inverters 242B and 243B. The inverter 242B of the control circuit 241B may receive the control signal from the internal control signal line 23. Responsive to the control signal from the internal control signal line 23, the inverter 242B may invert the control signal and provide the inverted control signal on the internal node Int 246B to the inverter 243B.

The inverters 243A and 243B may receive the inverted control signals from the internal nodes Int 246A and 246B, respectively. The inverter 243A may receive a data A signal at an input node Data A In 244A. Responsive to the inverted control signal, the inverter 243A may provide the data A signal with inversion to an output node Data A Out 245A. The inverter 243B may receive a data B signal at an input node Data B In 244B. Responsive to the inverted control signal, the inverter 243B may provide the data B signal with inversion to an output node Data B Out 245B.

In some embodiments, the input nodes Data A In 244A and Data B In 244B, the output nodes Data A Out 245A and Data B Out 245B, and the internal nodes Int 246A and 246B may be disposed in a conductive layer that may include conductive material. The conductive material may have low electrical resistance, for example, such as copper (Cu) or aluminum (Al). In some embodiments, the conductive layer including the input nodes Data A In 244A and Data B In 244B, the output nodes Data A Out 245A and Data B Out 245B, and the internal nodes Int 246A and 246B may be formed as a first metal layer (metal 1) below the second metal layer (metal 2) including the control signal line 21.

Each of inverters 242A, 243A 242B and 243B may include transistors. For example, the inverter 242A may include transistors including active regions 250AP and 250AN. The inverter 242B may include active regions 250BN and 240BP. The active regions 250AP, 250AN, 250BN and 250BP may be disposed in the substrate 251. The active region 250AP may receive a power supply voltage (e.g., VDD) from a power supply voltage line 253A through conductive segments and contact plugs. The active region 250AN and the active region 250BN may receive a power supply voltage (e.g., VSS) from another power supply voltage line 252 through conductive segments and contact plugs. The active region 250BP may receive the power supply voltage (e.g., VDD) from another power supply voltage line 253B through conductive segments and contact plugs. The power supply voltage lines 253A, 253B and 252 may be disposed in a conductive layer including conductive material. In some embodiments, the power supply voltage lines 253A, 253B and 252 may be disposed in the same conductive layer as the input nodes Data A In 244A and Data B In 244B, the output nodes Data A Out 245A and Data B Out 245B, and the internal nodes Int 246A and 246B. In some embodiments, the conductive layer including the power supply voltage lines 253A, 253B and 252 may be formed as the first metal layer (metal 1) below the second metal layer (metal 2) including the control signal line 21.

The internal control line 23 may be coupled to the signal buffer circuit 22 of FIG. 2B. The internal control line 23 may receive the control signal from the signal buffer circuit 22. The internal control line 23 may provide the control signal to the inverters 242A and 242B of the control circuits 241A and 241B. The internal control signal line 23 may be a local interconnect that is included in a local interconnect layer above the substrate 251 and below the conductive layer including the input nodes Data A In 244A and Data B In 244B, the output nodes Data A Out 245A and Data B Out 245B, and the power supply voltage lines 253A, 253B and 252. For example, the internal control line 23 may cross an area between the internal node 246A and the active region 250AP, and an area between the internal node 246B and the active region 250AN. In some embodiments, the local interconnect layer including the internal control signal line 23 may be less thick than the conductive layer including the input nodes Data A In 244A and Data B In 244B, the output nodes Data A Out 245A and Data B Out 245B, and the power supply voltage lines 253A, 253B and 252. The local interconnect layer including the internal control signal line 23 may have greater electrical resistance than the conductive layer including the input nodes Data A In 244A and Data B In 244B, the output nodes Data A Out 245A and Data B Out 245B, and the power supply voltage lines 253A, 253B and 252.

Figure 3:
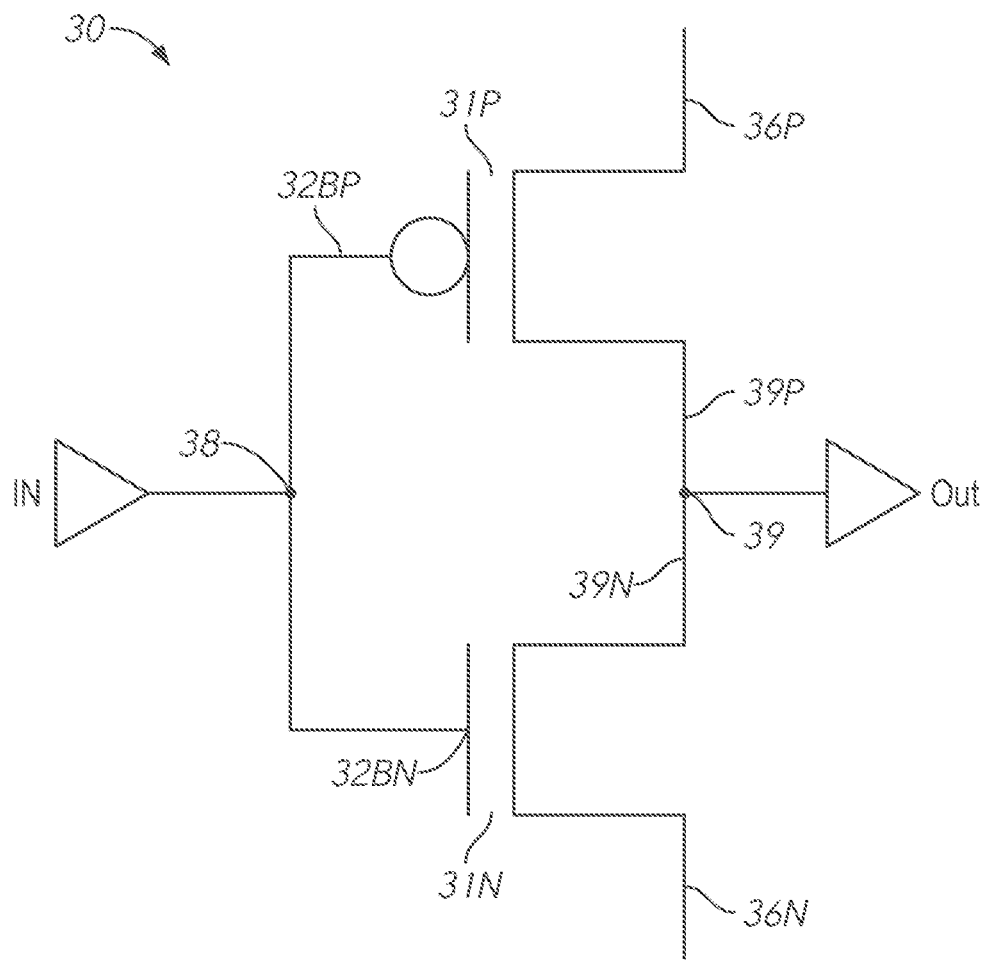
FIG. 3 is a circuit diagram of an inverter in a control circuit according to an embodiment of the present disclosure.

FIG. 3 is a circuit diagram of an inverter 30 according to an embodiment of the present disclosure. In some embodiments, the inverter 30 may be each of the inverters 242 of FIG. 2B or the inverters 242A and 242B of FIG. 2C. The inverter 30 may include a transistor 31P of a first type and a transistor 31N of a second type that is of a different polarity from the transistor 31P. The transistor 31P of the first type may be a p-channel field effect transistor and the transistor 31N of the second type may be an n-channel field effect transistor. The transistor 31P may include a gate 32BP, and the transistor 31N may include a gate 32BN. The transistors 31P and 31N may be coupled to an input node In 38 and an output node Out 39. A terminal 361P (typically, a source terminal) of the transistor 31P may be coupled to a power supply voltage line (e.g., VDD) and a terminal 36N (typically, a source terminal) of the transistor 31N may be coupled to another power supply voltage line (e.g., VSS). The gates 32BP and 32BN of the transistors 31P and 31N may receive an input signal In from the input node 38. One of the transistors 31P and 31N may provide an output signal to the output node Out 39 through either a terminal 39P (typically, a drain terminal) of the transistor 31P or a terminal 39N (typically, a drain terminal) of the transistor 31N.

Figure 4A:
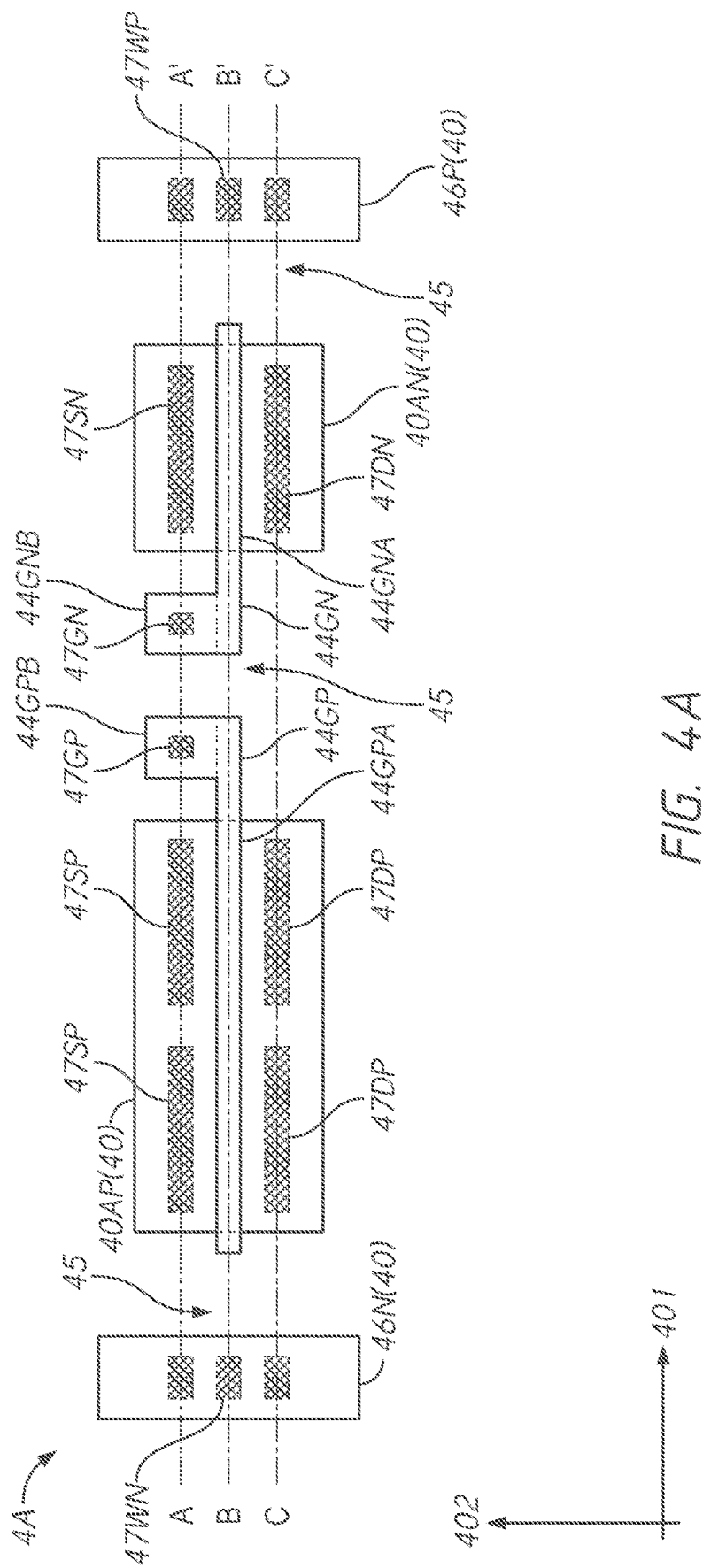
FIGS. 4A and 4B are diagrams of layouts of portions of an inverter according to an embodiment of the present disclosure.
Figure 4B:
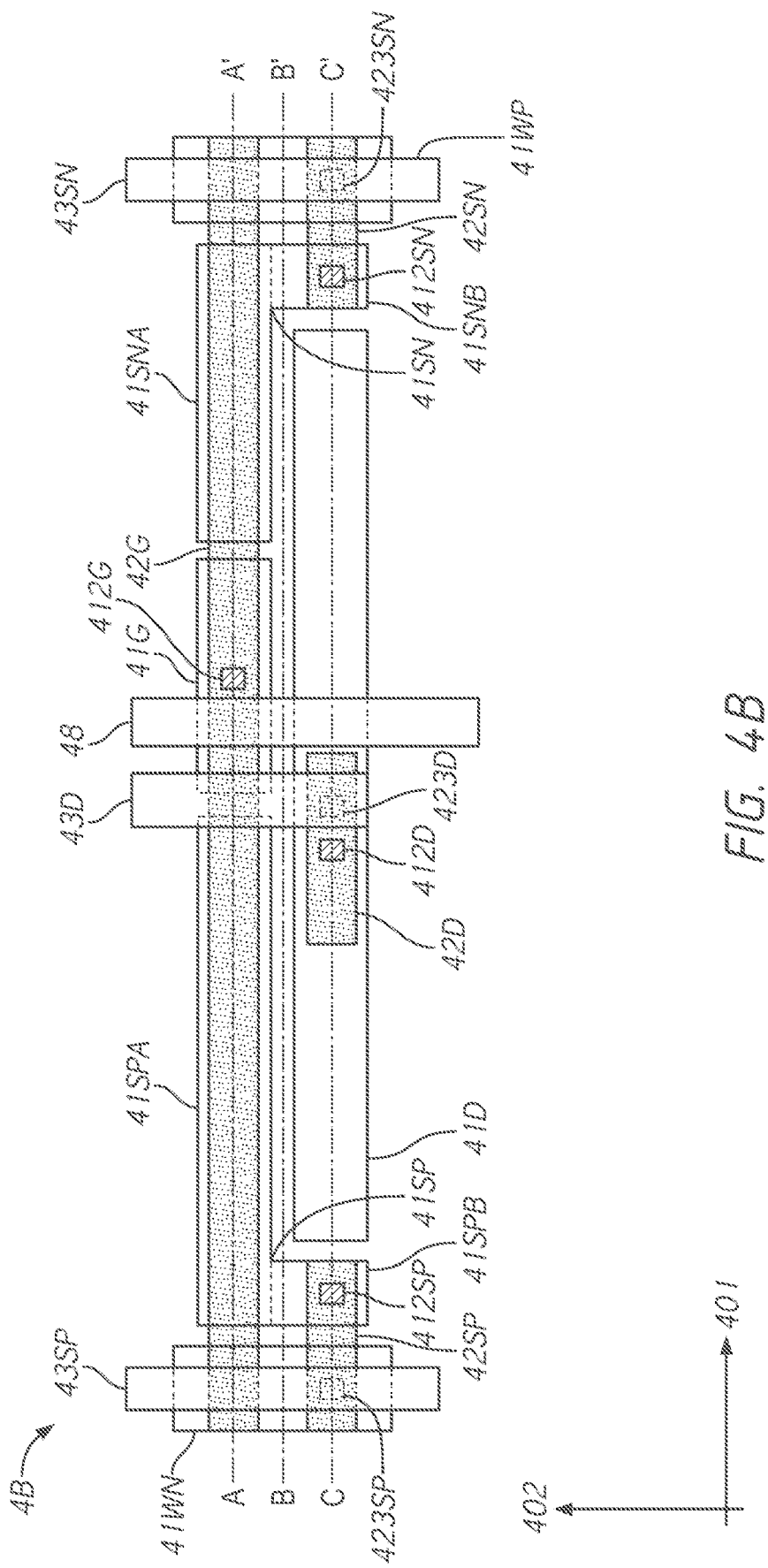
Figure 5A:
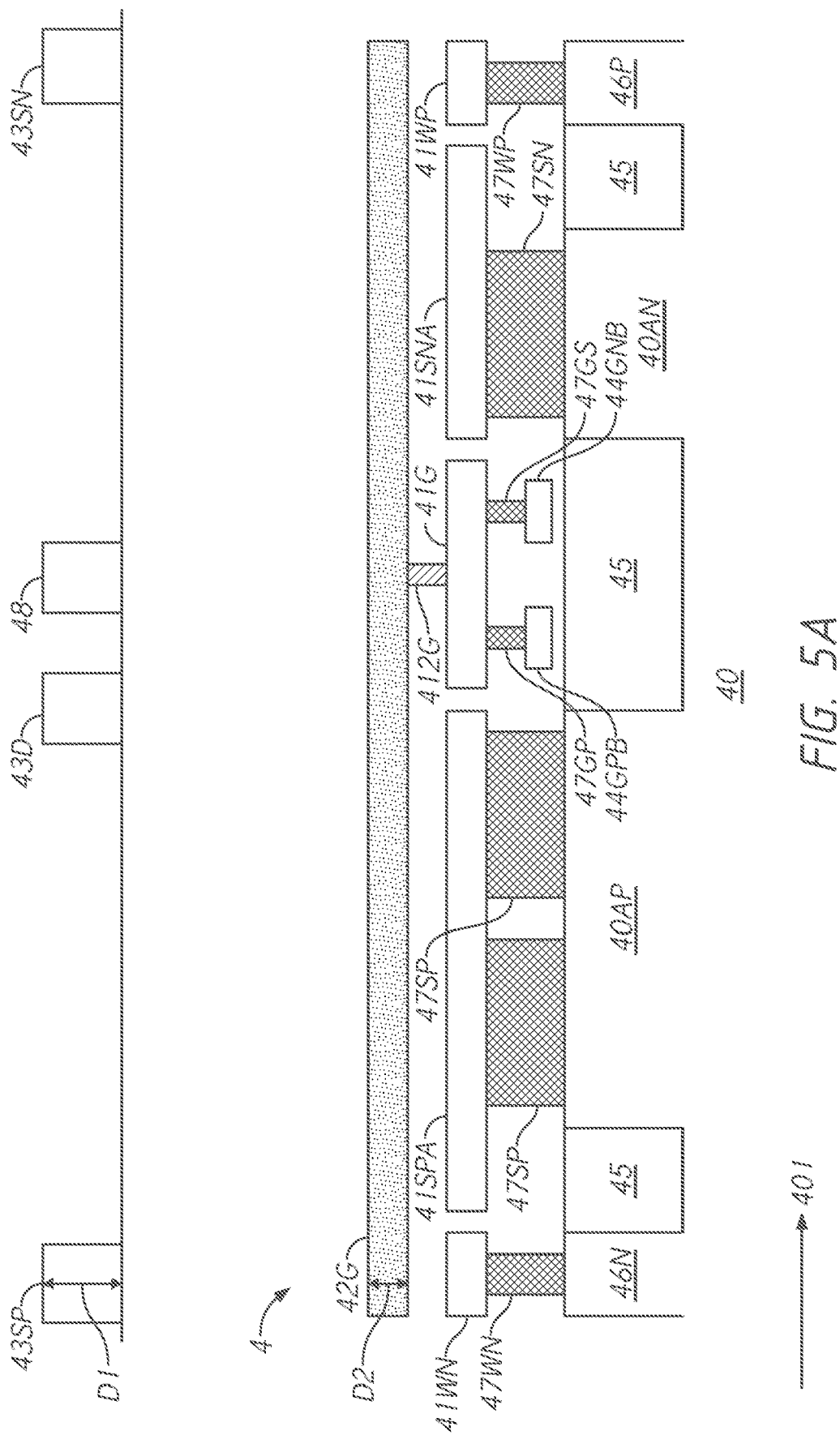
Figure 5B:
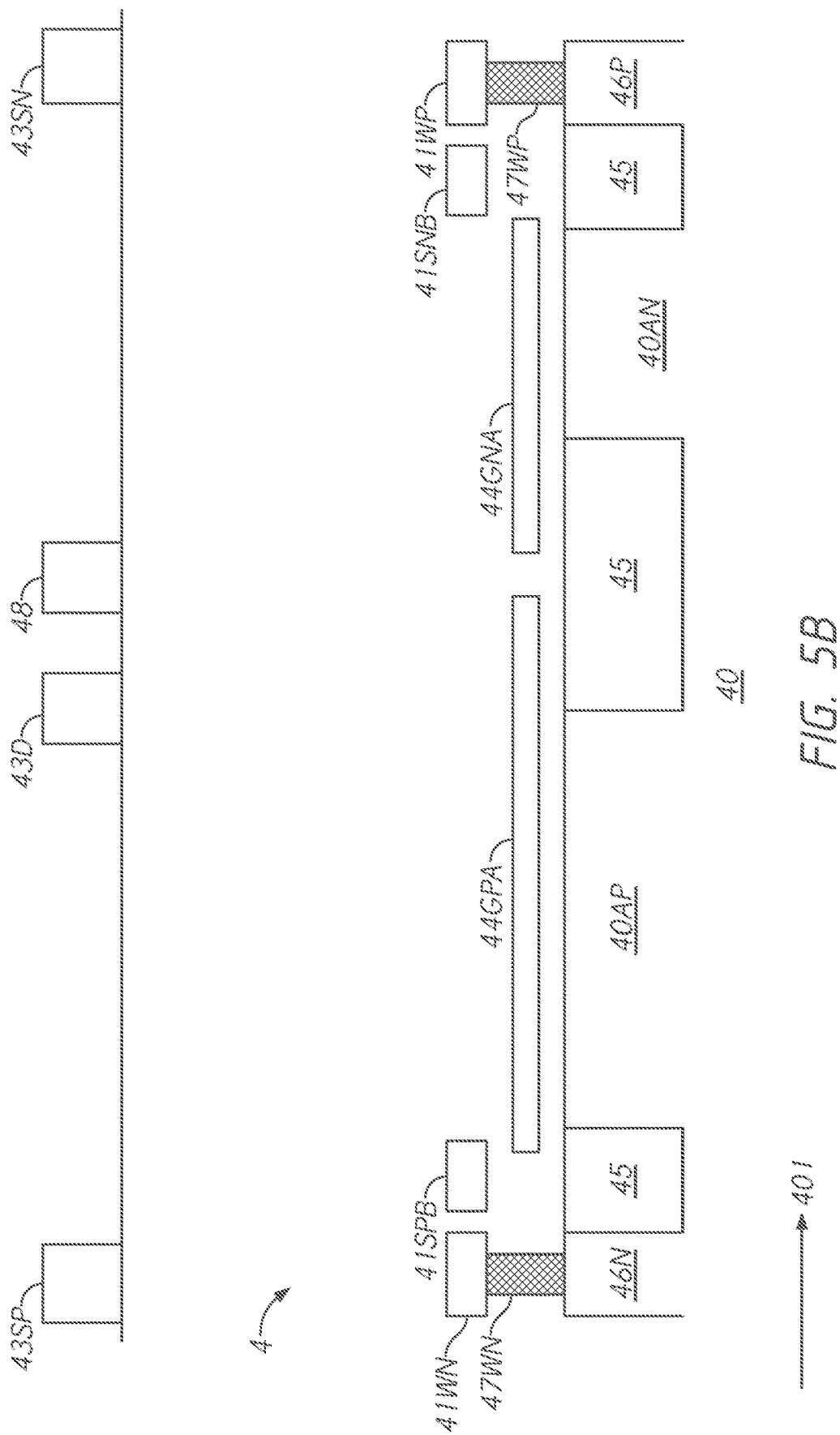

FIGS. 4A and 4B are diagrams illustrating layouts of portions 4A and 4B of an inverter 4 according to an embodiment of the present disclosure, respectively. FIGS. 5A-5C are diagrams illustrating vertical cross-sectional views of a schematic structure of the inverter 4 according to the embodiment of the present disclosure. In some embodiments, the inverter 4 may be the inverter 242A of FIG. 2C. The portion 4A of the inverter 4 may include active regions 40AP and 40AN disposed as portions of a substrate 40. In some embodiments, the active regions 40AP and 40AN and the substrate 40 may be the active regions 250A P and 250AN and the substrate 251 of FIG. 2C. The portion 4A of the inverter 4 may include an isolation region 45 (e.g., shallow trench isolation (STI)) surrounding the active regions 40AP and 40AN. Cross-sections A-A', B-B', C-C' shown in FIG. 4A are perpendicular to a surface of the substrate 40. The cross-sections A-A', B-B', C-C' may be parallel to one another and the cross-section B-B' may be in between the cross-sections A-A' and C-C'. In some embodiments, the inverter 4 may have structures along the cross-sections A-A', B-B' and C-C' as shown in FIGS. 5A, 5B, and 5C, respectively.

The inverter 4 may include gate electrodes 44GP and 44GN disposed in a gate wiring layer. The gate electrode 44GP may have an L-shape, and may include a portion 44GPA disposed above the active region 40AP and extending in a direction 401, and may further include another portion 44GPB disposed above the isolation region 45 and extending in another direction 402 perpendicular to the first direction 401. The gate electrode 44GN may have an L-shape, and may include a portion 44GNA disposed above the active region 40AN and extending in the first direction 401, and may further include another portion 44GNB disposed above the isolation region 45 and extending in the second direction 402 perpendicular to the direction 401. The portions 44GPA and 44GNA of the gate electrodes 44GP and 44GN may be disposed along an axis in the direction 401. A contact plug 47GP may be disposed on the other portion 44GPB of the gate electrode 44GP above the isolation region 45. A contact plug 47GN may be disposed on the other portion 44GNB of the gate electrode 44GN above the isolation region 45. In some embodiments, the contact plugs 47GP and 47GN may include or may be coupled to the gates 3213P and 32BN in FIG. 3 coupled to the input node In 38 respectively.

Each of the active regions 40AP and 40AN may include diffusion regions (e.g., source region and/or drain region) and a channel region (not shown) between the diffusion regions below the gate electrodes 44GP and 44GN respectively. In some embodiments, the active region 40AP and the gate 44GP may be included in the transistor 31P of FIG. 3. One or more contact plugs 47SP may be disposed on a diffusion region (e.g., source region) of the active region 40AP. In some embodiments, the contact plugs 47SP may include or may be coupled the terminal 36P in FIG. 3 coupled to a power supply voltage line (e.g., VDD). One or more contact plugs 47DP may be disposed on a diffusion region (e.g., drain region) of the active region 40AP. In some embodiments, the contact plugs 47DP may include or may be coupled the terminal 39P in FIG. 3 coupled the output node Out 39. In some embodiments, the contact plugs 47SP, 47DP and 47SN may have a rectangular shape extending in the direction 401. Similarly, the active region 40AN and the gate 44GN may be included in the transistor 31N of FIG. 3. One or more contact plugs 47SN may be disposed on a diffusion region (e.g., source region) of the active region 40AN. In some embodiments, the contact plugs 47SN may include or may be coupled to the terminal 36N in FIG. 3 coupled to another power supply voltage line (e.g., VSS). One or more contact plugs 47DN may be disposed on a diffusion region (e.g., drain region) of the active region 40AN. In some embodiments, the contact plugs 47DN may include or may be coupled to the terminal 39N in FIG. 3 coupled the output node Out 39. In some embodiments, the contact plugs 47SP, 47GP, 47GN and 47SN may be disposed along an axis in the direction 401. In some embodiments, the contact plugs 47DP and 47DN may be disposed along an axis in the direction 401.

The inverter 4 may include wells 46N and 46P) disposed as portions of the substrate 40. The well 46N may be adjacent to the active region 40AP in a direction opposite to the direction 401 and may be isolated from the active region 40AP by the isolation region 45. One or more contact plugs 47WN may be disposed on the well 46N. The one or more contact plugs 47WN may be coupled to another power supply voltage line different from the power supply voltage lines coupled to the contact plugs 47SP and 47SN. The well 46P may be adjacent to the active region 40AN in the direction 401 and may be isolated from the active region 40AN by the isolation region 45. One or more contact plugs 47WP may be disposed on the well 46P. The one or more contact plugs 47WP may be coupled to another power supply voltage line different from the power supply voltage lines coupled to the contact plugs 47SP, 47SN and 47WN.

In some embodiments, the portion 4B of the inverter 4 in FIG. 4B may be disposed on the portion 4A of the inverter 4 in FIG. 4A. The inverter 4 may include conductive segments 41G, 41D, 41SP and 41SN. In some embodiments, the conductive segments 41G, 41D, 41SP and 41SN may be included in a same conductive layer adjacent to and above the gate wiring layer including the gate electrodes 44GP and 44GN. The same conductive layer may also include conductive segments 41WN and 41WP disposed on conductive plugs 47WN and 47WP. The conductive segments 41G, 41D, 41SP, 41SN, 41WN and 41WP may include material that may have relatively high electrical resistance compared to material included in the conductive lines 43SP, 43D, 48 and 43SN. The material may also have hardness, heat resistance, corrosion resistance, and/or wear resistance. For example, the conductive segments 41G, 41D. 41SP, 41SN, 41WN and 41WP may include at least one of tungsten (W) or titanium nitride (TiN)

The conductive segment 41G is disposed on the contact plugs 47GP and 47GN and extends in the direction 401 over the other portions 44GPB and 44GNB of the gate electrodes 44GP and 44GN surrounded by the isolation region 45 between the active regions 40AP and 40AN. The conductive segment 41G may include or may be coupled to the input node In 38 in FIG. 3. The conductive segment 41D may be disposed on the contact plugs 47DP and 47DN and extends in the direction 401 over the active regions 40AP and 40AN. The conductive segment 41D may include or may be coupled to the output node Out 39 in FIG. 3.

The conductive segment 41SP may have an L-shape, and may include portions 41SPA and 41SPB adjacent to each other as shown in FIG. 4B. The conductive segment 41SP may be a power line that provides a power supply voltage to the source region of the active region 40AP through the contact plugs 47SP. The portion 41SPA is disposed on the contact plugs 47SP and extends in the direction 401 in FIG. 5A. The portion 41SPB is disposed above the isolation region 45 between the active region 40AP and the well 46N in FIGS. 5B and 5C. The portion 41SPB may be disposed between the conductive segment 41D and the conductive segment 41WN in FIGS. 4B and 5C, and extends from the portion 41SPA in a direction opposite to the direction 402 in FIG. 4B. The conductive segment 41SN may have an L-shape, and may include portions 41SNA and 41SNB adjacent to each other as shown in FIG. 4B. The conductive segment 41SN may be a power line that provides a power supply voltage to the source region of the active region 40AN through the contact plugs 47SN. The portion 41SNA is disposed on the contact plug 47SN and extends in the direction 401 in FIG. 5A. The portion 41SNB is disposed above the isolation region 45 between the active region 40AN and the well 46P in FIGS. 5B and 5C. The portion 41SNB may be disposed between the conductive segment 411D and the conductive segment 41WP in FIGS. 4B and 5C, and extends from the portion 41SNA in the direction opposite to the direction 402 in FIG. 4B.

In some embodiments, the conductive segment 41G may be disposed between the portions 41SPA and 41SNA of the conductive segments 41SP and 41SN along an axis included in the cross-section A-A'. In some embodiments, the conductive segment 41D may be disposed between the portions 41SPB and 41SNB of the conductive segments 41SP and 41SN along an axis in the direction 401.

A contact plug 412G may be disposed on the conductive segment 41G. In some embodiments, the contact plug 412G may include or may be coupled the input node In 38 in FIG. 3. A contact plug 412D may be disposed on the conductive segment 411D. In some embodiments, the contact plug 4121) may include or may be coupled the output node Out 39 in FIG. 3. A contact plug 412SP may be disposed on the portion 41SPB of the conductive segment 41SP. A contact plug 412SN may be disposed on the portion 41SNB of the conductive segment 41SN. The contact plugs 412SP, 412D and 412SN may be along an axis.

The inverter 4 may include a signal line 42G and conductive segments 42D, 42SP and 42SN. In some embodiments, the signal line 42G and the conductive segments 42D, 42SP and 42SN may be included in a same conductive layer adjacent to and above the conductive layer including the 41G, 41D, 41SP and 41SN. In some embodiments, the conductive layer including the signal line 42G and the conductive segments 42D, 42SP and 42SN may be formed as a local interconnect layer. The conductive layer including the signal line 42G and the conductive segments 42SP and 42SN including and the conductive layer including 41G, 41D, 41SP and 41SN may include a conductive material in common. For example, the conductive material may have relatively high electrical resistance compared to the material included in the conductive lines 43SP, 43D, 48 and 43SN. The conductive material may have hardness, heat resistance, corrosion resistance, and/or wear resistance. For example, the conductive material may include at least one of tungsten (W) or titanium nitride (TiN).

The signal line 42G may include or may be coupled to the input node In 38 in FIG. 3, and may provide an input signal. In some embodiments, the signal line 42G may be included in the internal control line 23 in FIGS. 2B-2C. The signal line 42G may extend in the direction 401 along an axis. The signal line 42G is disposed above and being parallel to the portion 41SPA of the conductive segment 41SP, the conductive segment 41G and the portion 41SNA of the conductive segment 41SN. The signal line 42G may also be disposed over the contact plugs 47GP and 47GN coupling the gate electrodes 44GP and 44GN to the conductive segment 41G. The signal line 42G may be on the contact plug 412G. The contact plug 412G may couple the signal line 42G to the conductive segment 41G. While the signal line 42G is above the portion 41SPA of the conductive segment 41SP, the portion 44GPA of the gate electrode 44GP may be disposed between the contact plugs 47SP and 47DP, being coupled to the signal line 42G through the portion 44GPB of the gate electrode 44GP that crosses under the signal line 42G, the contact plug 47GP, the conductive segment 41G and the contact plug 412G crossing the cross-section A-A'. Similarly, while the signal line 42G is above the portion 41SNA of the conductive segment 41SN, the portion 44GNA of the gate electrode 44GP may be disposed between the contact plugs 47SN and 47DN, being coupled to the signal line 42G through the portion 44GNB of the gate electrode 44GP crossing the cross-sections A-A' and B-B', the contact plug 47GN, the conductive segment 41G and the contact plug 412G.

The conductive segment 42D may be disposed above a portion of the conductive segment 41D. The conductive segment 42D may be on the contact plug 412D. The contact plug 412D may couple the conductive segment 42D to the conductive segment 41D. The conductive segment 42D may include or may be coupled to the output node Out 39 in FIG. 3.

The conductive segment 42SP may be disposed above the conductive segment 41WN and the portion 41SPB of the conductive segment 41SP. The conductive segment 42D may be on the contact plug 412SP. The contact plug 412SP may couple the conductive segment 42SP to the conductive segment 41SP. The conductive segment 42SN may be disposed above the conductive segment 41WP and the portion 41SNB of the conductive segment 41SN. The conductive segment 42SN may be on the contact plug 412SN. The contact plug 412SN may couple the conductive segment 42SN to the conductive segment 41SN. The conductive segments 42SP, 42D and 42SN may extend in the direction 401 along the axis included in the cross-section C-C', being in parallel to the signal line 42G. A contact plug 423D may be disposed on the conductive segment 42D. A contact plug 423SP may be disposed on the conductive segment 42SP above the conductive segment 41WN. A contact plug 423SN may be disposed on the conductive segment 42SN above the conductive segment 41WP.

The inverter 4 may include conductive lines 43SP, 43SN, 43D and 48 extending in the direction 402 perpendicular to the conductive segments 42SP, 42D and 42SN and the signal line 42G extending in the direction 401. The conductive lines 43D and 48 may be in between the conductive lines 43SP and 43SN. In some embodiments, the conductive lines 43SP, 43SN, 43D and 48 may be included in a same conductive layer above the conductive layer including the signal line 42G and the conductive segments 42D, 42SP and 42SN. The conductive lines 43SP, 43SN, 43D and 48 may include conductive material having electrical resistance lower than the electrical resistance of the conductive material of the signal line 42G and the conductive segments 42D, 42SP and 42SN. For example, the conductive material of the conductive lines 43SP, 43SN, 43D and 48 may include metal, such as copper (Cu) or aluminum (Al). In some embodiments, the conductive layer including conductive lines 43SP, 43SN, 43D and 48 may be formed as a first metal layer (metal 1).

The conductive line 43SP may include or may be coupled to a power supply voltage line 253A in FIG. 2C that provides a power supply voltage (e.g., VDD). The contact plug 423SP may couple the conductive line 43SP to the conductive segment 42SP. The conductive line 43SN may be include or may be coupled to another power supply voltage line 252 in FIG. 2C that provides another power supply voltage (e.g., VSS). The contact plug 423SN may couple the conductive line 43SN to the conductive segment 42SN. The contact plug 423D may couple the conductive segment 42D to the conductive line 43D. The conductive line 43D may include or may be coupled to the output node Out 39 of FIG. 3 and/or the internal node Int 246A in FIG. 2C. In some embodiment, the conductive line 48 may be the input node 244A which passes over the inverter 242A to provide the data A signal to the inverter 243A in FIG. 2C. The inverter 4 may not be coupled to the conductive line 48.

The local interconnect layer including the conductive line 42G and the conductive segments 42D, 42SP and 42SN may be disposed between the substrate 40 including active regions 40AP and 40AN and the first metal layer including the conductive lines 43SP, 43SN, 43D and 48. Furthermore, the local interconnect layer including the signal line 42G and the conductive segments 42D, 42SP and 42SN may be disposed between the conductive layer including the conductive segments 41G, 411D, 41SP, 41SN, 41WN and 41WP and the first metal layer. As shown in FIGS. 5A-5C, the local interconnect layer including the conductive line 42G and the conductive segments 42D, 42SP and 42SN may be disposed relatively close to or in proximity to the interconnect layer including the conductive segments 41G, 41D, 41SP, 41SN, 41WN and 41WP, and relatively far from the first metal layer. A distance from the local interconnect including the conductive line 42G to the first metal layer including the conductive lines 43SP, 43SN, 43D and 48 is longer than a distance from the local interconnect including the conductive line 42G to the local interconnect layer including the conductive segments 41G, 41D, 41SP, 41SN, 41WN and 41WP. The local interconnect layer having a thickness (e.g., height) D2, including the signal line 42G and the conductive segments 42D, 42SP and 42SN may be less thick than the first metal layer having a thickness (e.g., height) D1, including the conductive lines 43SP, 43SN, 43D and 48. For example, the height D1 may be ten times larger or more than the height D2. The signal line 42G in the local interconnect layer takes relatively small space, and results in increasing distances to other wirings of other signal lines also providing signals to multiple transistors. The signal line 42G or the internal control line 23 may have less parasitic capacitance caused by signal interference with other wirings. The local interconnect layer including the signal line 42G and the conductive segments 42D, 42SP and 42SN may have a higher electrical resistance than the first metal layer including the conductive lines 43SP, 43SN, 43D and 48. The signal line 42G or the internal control line 23 in the local interconnect layer may reduce power consumption in providing a control signal to inverters.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present disclosure herein should not be limited by the particular disclosed embodiments described above.

What is claimed is:

1. An apparatus comprising:
   a transistor configured to transmit a signal, the transistor comprising:
     an active region, including a source region and a drain region, disposed in a substrate; and
     a gate electrode in a gate wiring layer above the substrate;
   a power line and a first signal line in a first conductive layer that is adjacent to and above the gate wiring layer, the power line coupled to the source region and the first signal line coupled to the drain region;
   a second signal line in a second conductive layer that is adjacent to and above the first conductive layer, the second signal line coupled to the gate electrode and extending in a first direction; and
   a power supply voltage line in a third conductive layer over the second conductive layer, the power supply voltage line coupled to the power line and extending in a second direction perpendicular to the first direction, wherein
   the first signal line and the second signal line comprises a first conductive material in common,
   the power supply voltage line comprises a second conductive material different from the first conductive material,
   each of the first and second conductive layers is a local interconnect layer, and
   the third conductive layer is a metal layer.

2. The apparatus of claim 1, wherein the first conductive material comprises at least one of tungsten (W) or titanium nitride (TiN).

3. The apparatus of claim 1, wherein the second conductive material comprises at least one of copper (Cu) or aluminum (Al).

4. The apparatus of claim 1, wherein the power supply voltage line has an electrical resistance lower than an electrical resistance of the power line.

5. The apparatus of claim 1, wherein the power supply voltage line has a height that is equal to or greater than ten times of a height of the second signal line.

6. The apparatus of claim 1, wherein the first signal line is further coupled to an output line coupled to an input of another transistor.

7. An apparatus, comprising:
   a signal buffer circuit configured to receive a signal from a control signal line in a first conductive layer and further configured to provide the signal with a delay to an internal control signal line in a second conductive layer, the second conductive layer being different from the first conductive layer; and
   a plurality of control circuits coupled to the internal control signal line and configured to receive the signal from the internal control signal line, wherein
   the apparatus further comprises:
     a memory array;
     an input/output circuit; and
     a data transmission circuit configured to receive read data from the memory array and to provide the read data to the input/output circuit and further configured to receive write data from the input/output circuit and to provide the write data to the memory array, the data transmission circuit comprises the signal buffer circuit, and
   the signal buffer circuit is further configured to receive a control signal to control at least one of a data input timing or a data output timing.

8. The apparatus of claim 7, wherein the second conductive layer has a thickness less than a thickness of the first conductive layer.

9. The apparatus of claim 7, wherein the first conductive layer comprises a first material and the second conductive layer comprises a second material, and
   wherein the second material has electrical resistance higher than electrical resistance of the first material.

10. The apparatus of claim 7, wherein
    the signal buffer is further included in a command decoder, and
    the plurality of control circuits are included in at least one of a column decoder or a row decoder.

11. The apparatus of claim 7 further comprising a substrate, wherein the second conductive layer is between the substrate and the first conductive layer.

12. The apparatus of claim 11 further comprising a power supply voltage line in a third conductive layer, the power supply voltage line configured to provide a power supply voltage to the plurality of control circuits,
    wherein the first conductive layer is between the second conductive layer and the third conductive layer.

13. The apparatus of claim 12 further comprising a conductive segment coupled to the power supply voltage line in a fourth conductive layer above the substrate,
    wherein the second conductive layer is between the first conductive layer and the fourth conductive layer.

14. An apparatus comprising:
    an input signal line in a first conductive layer and extending in a first direction and configured to provide a control signal;
    an output signal line in a second conductive layer and extending in a second direction perpendicular to the first direction and configured to provide an inverted control signal; and
    a transistor comprising:
      a gate electrode includes a portion extending in the first direction, the portion configured to receive the control signal;
      a contact plug on a portion of an active region; and
      a conductive segment extending in the first direction in a third conductive layer, the conductive segment coupled to the contact plug and the output signal line, wherein the first conductive layer is between the second conductive layer and the third conductive layer, and wherein a distance from the first conductive layer to the second conductive layer is longer than a distance from the first conductive layer to the third conductive layer.

15. The apparatus of claim 14, wherein the first conductive layer and the third conductive layer comprise at least one of tungsten (W) or titanium nitride (TiN).

16. The apparatus of claim 14, wherein the conductive segment is a first conductive segment, and wherein the transistor further comprises a second conductive segment in the third conductive layer and the second conductive segment configured to receive a power supply voltage and further configured to provide the power supply voltage to another portion of the active region.

17. The apparatus of claim 16, wherein the second conductive segment comprises:

a first portion extending in the first direction under the input signal line and configured to provide the power supply voltage to the other portion of the active region; and a second portion configured to receive the power supply voltage from a power supply voltage line in the second conductive layer, wherein the second portion extends from the first portion in the second direction between the power supply voltage line and the first conductive segment.

18. The apparatus of claim 16, wherein the portion of the gate electrode is a first portion of the gate electrode, wherein the gate electrode further comprises:

a second portion extends from the first portion in a third direction perpendicular to the first direction, the second portion crossing under the input signal line.

* * * * *

UNITED STATES PATENT AND TRADEMARK OFFICE
CERTIFICATE OF CORRECTION

PATENT NO. : 11,527,281 B2
APPLICATION NO. : 17/218023
DATED : December 13, 2022
INVENTOR(S) : Kenichi Watanabe It is certified that error appears in the above-identified patent and that said Letters Patent is hereby corrected as shown below:

On the Title Page

| | | Should be |
|---|---|---|
| Item (72) Inventors | Kenichi Watanabe, Kanagawa (JP) | Kenichi Watanabe, Sagamihara, Kanagawa (JP) |
| | Moeha Shibuya, Kanagawa (JP) | Moeha Shibuya, Sagamihara, Kanagawa (JP) |

Signed and Sealed this
Seventh Day of March, 2023

Katherine Kelly Vidal
*Director of the United States Patent and Trademark Office*